United States Patent [19]

Gray et al.

[11] Patent Number: 5,625,830

[45] Date of Patent: Apr. 29, 1997

[54] REDUCED CIRCUIT, HIGH PERFORMANCE, BINARY SELECT ENCODER NETWORK

[75] Inventors: Kenneth S. Gray, Jericho; Steven F. Oakland, Colchester, both of Vt.

[73] Assignee: International Business Machines Corp., Armonk, N.Y.

[21] Appl. No.: 289,826

[22] Filed: Aug. 12, 1994

[51] Int. Cl.$^6$ .................................................. G06F 15/00
[52] U.S. Cl. .................... 395/800; 341/52; 341/92; 341/160
[58] Field of Search ............................. 395/800, 478, 395/485, 156; 341/94, 156, 158, 159, 160, 52, 95, 157; 340/64

[56] References Cited

U.S. PATENT DOCUMENTS

| | | | |
|---|---|---|---|
| 4,389,636 | 6/1983 | Riddle, Jr. | 341/71 |
| 4,571,735 | 2/1986 | Furse | 375/293 |
| 4,835,672 | 5/1989 | Zenk et al. | 395/478 |
| 4,875,180 | 10/1989 | Kregness et al. | 364/715.03 |
| 4,887,084 | 12/1989 | Yamaguchi | 341/160 |
| 5,243,348 | 9/1993 | Jackson | 341/64 |
| 5,260,706 | 11/1993 | Chung | 341/160 |
| 5,265,258 | 11/1993 | Fiene et al. | 395/485 |
| 5,463,395 | 10/1995 | Sawai | 395/156 |
| 5,506,844 | 4/1996 | Rao | 370/84 |
| 5,511,222 | 4/1996 | Shiba et al. | 395/800 |

Primary Examiner—Meng-Ai T. An
Attorney, Agent, or Firm—Thornton & Thornton

[57] ABSTRACT

This disclosure sets forth the use of input 2-bit encoders to form an encoder network capable of handling any number of encoder inputs by using the VALID output of each input 2-bit encoder as a data input to a later stage encoder and to select 2-way selector circuits using the code outputs of the input 2-bit encoders for selection of highest match.

This is accomplished through the use of first and second input $2^n$ encoders, the first being provided with the $2^n$ high order inputs and the second being supplied with the $2^n$ low order inputs and the outputs of the input encoders being coupled to a single 2-input encoder and n 2-way selectors to provide an encoder network with fewer circuits and better performance due to fewer stages of delay.

If the number of desired inputs to the network is less than $2^n$ but greater than $2^{n-1}$, known logic reduction techniques may be applied to the next higher $2^n$ input encoder network to implement the desired $2^{n-1}$ encoder network.

7 Claims, 3 Drawing Sheets

REDUCED CIRCUIT, HIGH PERFORMANCE, BINARY SELECT ENCODER NETWORK

FIELD OF THE INVENTION

This invention relates generally to encoder networks and, more particularly, to encoder networks which can encode any number of inputs.

BACKGROUND OF THE INVENTION

Some encoders, to handle more than one active input signal, require extra circuits to prevent more than one encoder input from being active. These additional circuits not only increase the number of required circuits but also add undesirable delays to the circuit.

Other encoders, known as prioritized encoders, are designed such that, when more than one input is active, a code is provided which identifies one of the active inputs as being valid with no indication that any other of the inputs may also be active.

Still other encoders use the "ripple inhibit" approach in which the inputs are numerically ordered and each input, beginning with input one, is evaluated and if any one input is activated all the other higher ordered inputs are blocked and prevented from affecting the output code. This effect is propagated all the way to the penultimate input which if active blocks the ultimate input. For any significant number of inputs, this ripple approach, although quite useful, and even when provided with carry look-ahead is very time consuming and requires significantly more circuitry.

Accordingly, there now exists a need for an improved encoder network which avoids all the above described problems associated with encoder networks found in the prior art.

The present invention, achieves these desirable results, by applying the valid output of a first two bit encoder as a data input to a later stage of encoding which, when combined with a two way selector driven by a valid output of a the first stage encoder for selection of highest match, reduces the number of required circuits and their attendant delay. The present invention thus significantly reduces the logic propagation time usually encountered with such networks.

OBJECTS OF THE INVENTION

An object of the present invention is to provide an improved encoder network which requires fewer encoder circuits and their attendant delay thus achieving a significant reduction in the logic propagation time usually encountered with such networks.

It is another object of the present invention to reduce the encoding of an N-bit bus from an order ($2^n$) problem to an order (n) problem where n is a positive number.

It is another object of the invention to provide all the above and other objects and advantages, of the present invention, while reducing the complexity of the required support logic when performing pattern matching of incoming signals.

SUMMARY OF THE INVENTION

These desirable results and other objects and advantages, of the present invention, are realized and provided by an encoder network wherein first and second input $2^n$ encoders, the first being provided with the $2^n$ high order inputs and the second being supplied with the $2^n$ low order inputs, have their outputs coupled to a single 2-input encoder and to a plurality of two way selectors equal in number to the inputs provided on the input $2^n$ encoders. This arrangement provides an encoder network with fewer circuits and better performance with less inherent circuit delay.

It should be noted that there are limitations in that the disclosed encoder network assumes $2^n$ inputs where n is a positive integer. However, if the number of desired inputs is less than $2^n$ but greater than $2^{n-1}$, known logic reduction techniques may be applied to the disclosed $2^n$ input encoder to implement the desired encoder network.

The present invention also is directed to a binary-select encoder network for encoding $2^{i+1}$ inputs, where i is a positive number, ranked from lowest order to highest order. This requires first and second $2^i$ input encoders, the first of which has, as its inputs, the $2^i$ high order inputs and the second of which has, as its inputs, the $2^i$ low order inputs, as well as a 2-input encoder and a plurality of 2-way selector circuits equal in number to i. When operating, the VALID output of said first $2^i$ input encoder is fed to the first input of said 2-input encoder and the VALID input of said second $2^i$ input encoder is fed to the second input of said 2-input encoder and to the SELECT input of the 2-way selectors.

The encoded inputs of the first $2^i$ input encoder are also sent to respective 0 inputs of the 2-way selector circuits and the encoded outputs of said second $2^i$ input encoder are sent to respective 1 inputs of the 2-way selector circuits. The outputs of the first and second $2^i$ encoders, having the same order bit position, are input to the same 2-way encoder, such that the VALID output of said 2-input encoder is the VALID output of the encoder network and the encoded output of the 2-input encoder which is the most significant bit of the output of said encoder network and the encoded outputs of said 2-way selectors being the other outputs of said encoder network and are ordered in the order of the inputs from said $2^i$ input encoders.

These and other objects, features, and advantages of the invention will be apparent from the following more particular description of the preferred embodiment of the invention as illustrated in the accompanying drawings.

DESCRIPTION OF THE PREFERRED EMBODIMENT

Figure 1:
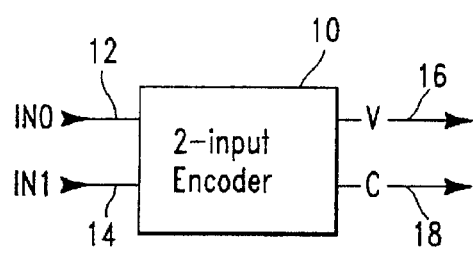
FIG. 1 shows in block form a two bit encoder block.

Basically, the present invention, as will be more fully set forth below, describes a $2^n$-input encoder network formed of two $2^{n-1}$-input encoder networks including 2-way selector circuits. In the present invention the encoding function is based on binary selection of the code from one of the $2^{n-1}$-input encoders. A VALID signal is produced using the Boolean OR function of the VALID signals coming from the two $2^{n-1}$-input encoders.

Referring now to the drawings and especially FIGS. 1 to 9 the present invention will be described.

The disclosed encoder network is constructed from two types of basic building blocks: 2-input encoders and 2-way selectors. These two basic building blocks and their operation will be first described. Various implementations of the invention will then be described in term of these two building blocks and their unique interconnection in accordance with the present invention. Finally, a general method for encoding any number of inputs will be described.

In FIG. 1 there is illustrated a block diagram of a 2-input encoder 10 having two inputs 12 and 14 and two outputs 16 and 18. The output 16 is a VALID or V output and is activated whenever either input 12 or 14 is activated. This is the Boolean OR operation. The other output 18 is a CODE or C output and is activated whenever the second input 14 of the two inputs 12 and 14 is activated. The truth table for the 2-input encoder, where "1" indicates "active" and "0" indicates "inactive", is as follows:

| INPUT 12 | INPUT 14 | V | C |
|---|---|---|---|
| 0 | 0 | 0 | X |
| 1 | 0 | 1 | 0 |
| 0 | 1 | 1 | 1 |
| 1 | 1 | 1 | 1 |

Whenever the VALID output 16 is active, the CODE output 18 indicates which input 12 or 14 is active. The CODE Output 18 gives a 1-bit binary "address" of the activated input 12 or 14. In the case where both inputs 12 and 14 are active, the CODE output 18 gives the binary "address" of the second (higher-numbered) input 14. Therefore, the second input 14 to the encoder 10 is said to have priority over the first input 12. The assignment of numbers to the inputs 12 and 14 is entirely arbitrary, and the CODE output 18 may alternatively be considered to select the lower-numbered input when both are active.

Figure 2:
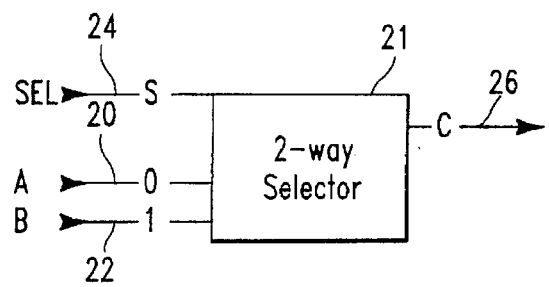
FIG. 2 shows in block form a two bit selector block.

The two-way selector block, shown in FIG. 2, is provided with two inputs 20 and 22, either which may be selected by a controlled selector signal SEL on input 24, and a single output 26.

In operation when, for example, a signal "A" is applied to input 20 and a signal "B" is applied to the input 22 then the output 26 is either A or B depending on the state of the select signal SEL. If the selected signal is active or High, e.g., a "1" the signal B appearing on input 22 is selected. When the selected signal SEL is inactive or low, i.e., a "0" the signal A on input 24 is selected.

This is set forth in the table below:

| SEL | OUTPUT 26 |
|---|---|
| 0 | A |
| 1 | B |

Figure 3:
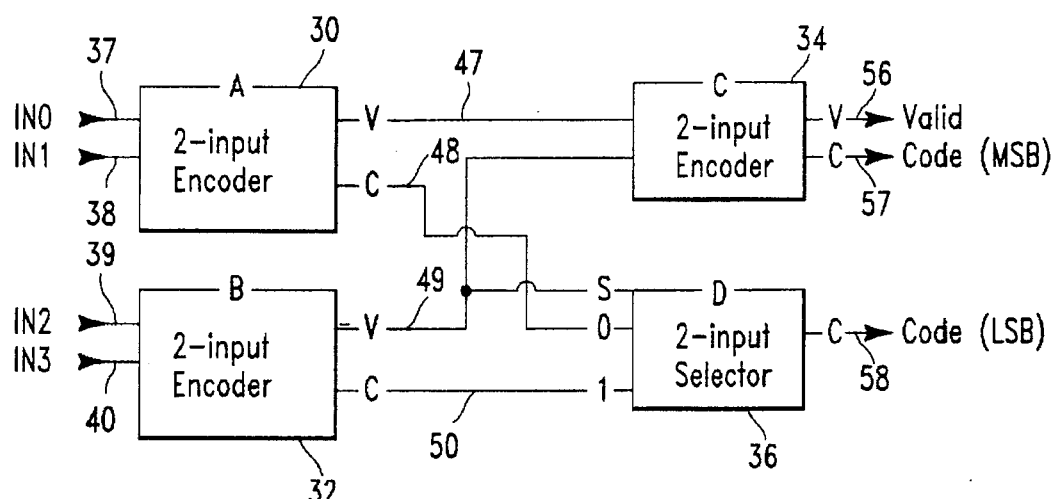
FIG. 3 shows in block form a four input encoder in accordance with the present invention.

FIG. 3 shows a 4-input encoder constructed in accordance with the invention and comprises two 2-input encoders 30 and 32 both of which are coupled to a 2-input encoder 34 and a 2-way selector 36. The encoder 30 has a pair of inputs 37 and 38 and a VALID output on output line 47 and a CODE output on output line 48. Similarly the encoder 32 has a pair of inputs 39 and 40 and a VALID output on line 49 and a CODE output on line 50. The VALID outputs applied on lines 47 and 49 from each of the 2-input encoders 30 and 32 are coupled to the inputs of a 2-input encoder 34 in which they may be further encoded. Additionally the VALID output of encoder 32 appearing on line 49, via line 51 is fed to the select input S of the selector circuit 36. The CODE outputs on lines 48 and 50, of encoders 30 and 32 respectively, are coupled to the inputs of the 2-way selector circuit 36. If either of the inputs 42 or 44 of encoder 32 is active, the VALID output of encoder 32 is active, and since this is connected, via line 49, to the second input of encoder 34, it has priority over the VALID input V, on line 47, from encoder 30, and the high-order code bit (MSB) on line 57 is activated.

This high-order code bit (MSB), on line 57, indicates which encoder, 30 or 32, (if either) has an active input.

The output line 58 of the 2-way selector circuit provides the other code bit (LSB) selected from the C output, on either lines 54 or 50, from encoder 30 and 32 respectively. If encoder 32 has an input that is active, then the output of encoder 32 is selected. If input 40 is active, the LSB code bit is active, i.e., a "1", but if input 40 is not active but input 39 is active, the LSB code bit is inactive, i.e., a "0".

If neither input 40 nor 39 is active, the CODE output, on output line 48, of encoder 32 is selected as the LSB. If input 40 is active, the LSB is also active.

Thus the LSB is active if either input 40 or input 39 is the encoded active input.

The truth table for this four input encoder is set forth below:

| INPUT 40 | INPUT 39 | INPUT 38 | INPUT 37 | V | C (MSB) | C (LSB) |
|---|---|---|---|---|---|---|
| 1 | — | — | — | 1 | 1 | 1 |
| 0 | 1 | — | — | 1 | 1 | 0 |
| 0 | 0 | 1 | — | 1 | 0 | 1 |
| 0 | 0 | 0 | 1 | 1 | 0 | 0 |
| 0 | 0 | 0 | 0 | 0 | X | X |

Thus, it is demonstrated how a 4-input encoder can constructed from two 2-input encoders, coupled to a 2-way selector and an additional 2-input encoder.

Further expanding on these teachings, an 8-input encoder can be constructed from two 4-input encoders 60 and 62, a 2-input encoder 64 and two 2-way selector circuits 66 and 68, as shown in FIG. 3. Encoder 60 has four inputs 69, 70, 71, and 72 and outputs 73, 74, and 75. Encoder 62 has four inputs 76, 77, 78, and 79 and outputs 80, 81 and 82. The VALID outputs, on lines 73 and 80 respectively, of each of the 4-input encoders 60 and 62 are further encoded by a 2-input encoder 64. If any of the inputs 76, 77, 78, or 79 to encoder 62 are active, the VALID output on line 80 of encoder 62 is active. Since the VALID output of encoder 62 is connected to the second input of the 2-input encoder 64, it has priority over any input from encoder 60, and its output line 86, the high-order code bit (MSB) output line, is active.

Thus, the output line 86, i.e., the high-order code bit (MSB), of the 2-input encoder 64 indicates whether or not either 4-input encoder, 60 or 62, has an active input.

The other code bits are selected from the code outputs, 74, 75, 81, or 82 of either encoder 60 or encoder 62 by the 2-way selector circuits 66 and 68 and these code bits appear on either output 87 or 88. Since each of these 2-bit codes identifies one of four inputs, one of these 2-bit codes is selected as the low-order two bit code. For example, if encoder 62 has an input, either 76, 77, 78, or 79, that is active, then the 2-bit code from encoder 62 is selected. Otherwise, the code from encoder 60 is selected.

Thus, it has been shown that an 8-input encoder can be readily constructed from two 4-input encoders, a 2-input encoder, and two 2-way selector circuits.

The truth table for this 8 bit encoder is as follows:

$2i$ inputs, one of these CODE bits is selected as the low-order bit. If encoder 92 has an input that is active, then the CODE bit from encoder 92 is selected. Otherwise, the CODE bit from encoder 90 is selected.

Thus, in general, an encoder with $2i+1$ inputs can, in accordance with the teachings of the present invention, be constructed from two $2i$-input encoders, a single 2-input encoder, and i two-way selectors.

The present invention can also be employed when the number of inputs is not a positive integer power of 2.

If the number of inputs to be encoded is not a positive integer power of two, the disclosed network can be reduced by known logic reduction techniques to a minimal implementation so that one can encode any number of input signals. Thus, for example, the 6-input encoder of FIG. 6 was derived from the 8-input encoder of FIG. 4.

The implementation procedure would be to implement the disclosed $2^n$-input encoder, where n is the minimum positive integer such that $2^n$ is greater than or equal to the desired number of inputs. Then, if $2^n$ exceeds the desired number of inputs, all undesired inputs are considered inactive, and

| INP 69 | INP 70 | INP 71 | INP 72 | INP 76 | INP 77 | INP 78 | INP 79 | OUT 84 | OUT 86 | OUT 87 | OUT 88 |
|---|---|---|---|---|---|---|---|---|---|---|---|
| 1 | — | — | — | — | — | — | — | 1 | 1 | 1 | 1 |
| 0 | 1 | — | — | — | — | — | — | 1 | 1 | 1 | 0 |
| 0 | 0 | 1 | — | — | — | — | — | 1 | 1 | 0 | 1 |
| 0 | 0 | 0 | 1 | — | — | — | — | 1 | 1 | 0 | 0 |
| 0 | 0 | 0 | 0 | 1 | — | — | — | 1 | 0 | 1 | 1 |
| 0 | 0 | 0 | 0 | 0 | 1 | — | — | 1 | 0 | 1 | 0 |
| 0 | 0 | 0 | 0 | 0 | 0 | 1 | — | 1 | 0 | 0 | 1 |
| 0 | 0 | 0 | 0 | 0 | 0 | 0 | 1 | 1 | 0 | 0 | 0 |
| 0 | 0 | 0 | 0 | 0 | 0 | 0 | 0 | 0 | X | X | X |

Figure 5:
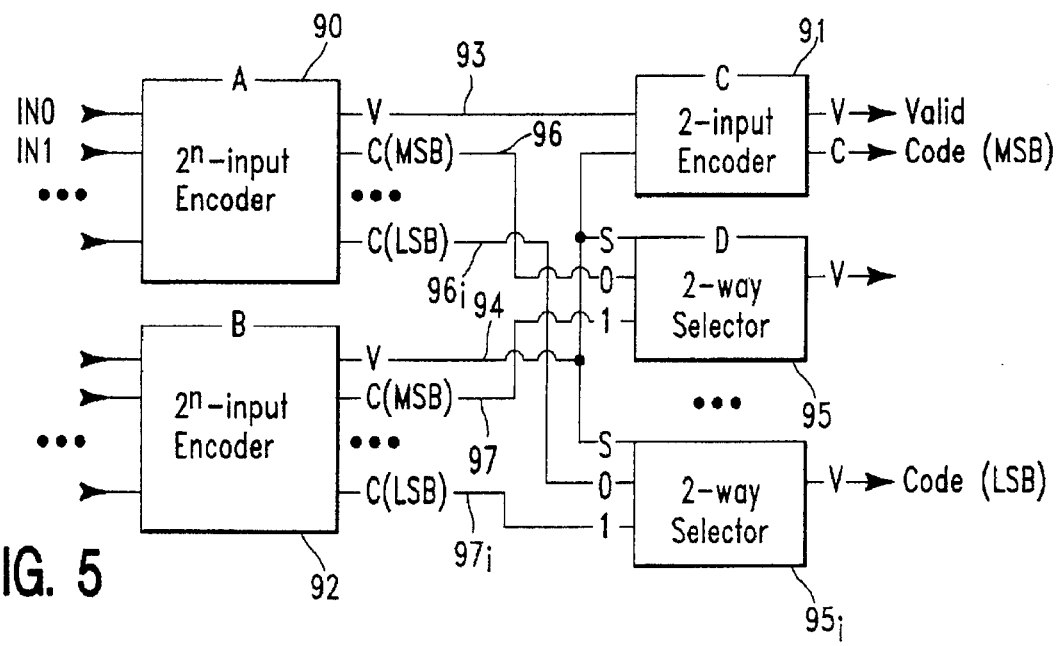
FIG. 5 shows in block form an encoder in accordance with the present invention in which the number of inputs is a positive integer power of 2.
Figure 4:
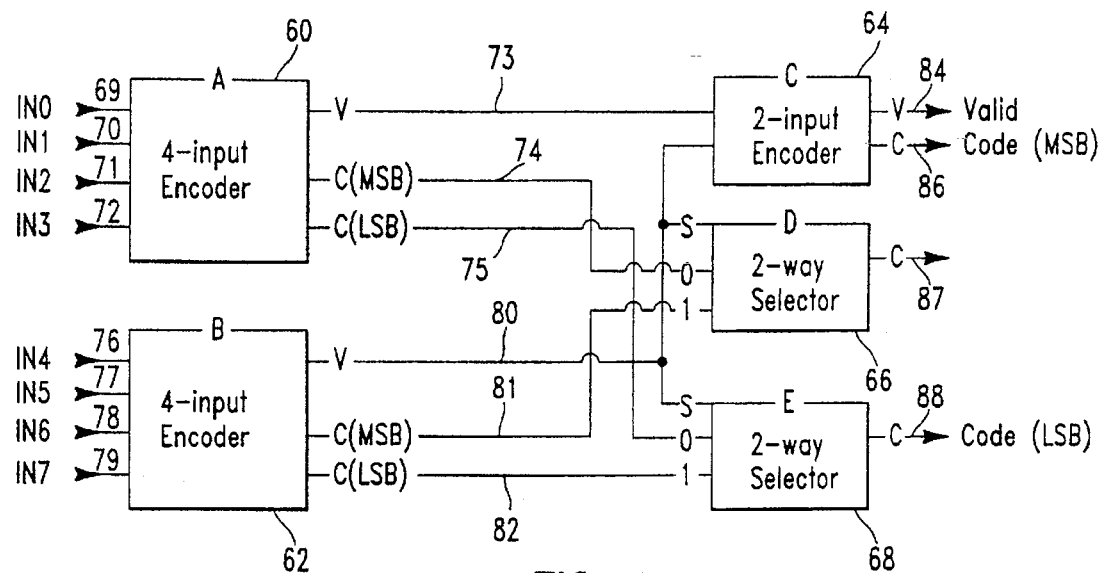
FIG. 4 shows in block form an eight bit encoder in accordance with the present invention.

FIG. 5 set forth a block diagram of an encoder arrangement, in accordance with the present invention, where the number of inputs is any positive integer power of 2.

It should now be obvious that an encoder with $2^{i+i}$ inputs may be constructed from two $2^i$-input encoders 90 and 92, each having a VALID output, 93 and 94 respectively, and a plurality of CODE outputs 96 through 96$i$ and 97 through 97$i$. The Valid output 93, of the $2^i$-input encoder 90, is connected directly to the first input of a 2-input encoder 91 and the Valid output 94, of the other of the $2^i$-input encoder 92, is connected directly to the second input of the 2-input encoder 91 and to the SEL inputs of a series of 2-way selectors 95 through 95$i$. The high order CODE outputs (MSB) 96 and 97 of the $2^i$-input encoders 90 and 92 respectively are connected to the inputs of the first 2-way selector 95 and the next lower Code outputs, in the series 96 through 96$i$ and 97 through 97$i$, are connected to the inputs of the next 2-way selector in the series 95 through 95$i$. This arrangement is continued until the lowest order CODE output (LSB) 96$i$ and 97$i$.

If any of the inputs to encoder 92 are active, the Valid output 94 of encoder 92 is active. Since the VALID output of encoder 92 is connected to the second input of encoder 91, it has priority over the input from encoder 90. Therefore, if any input to encoder 92 is active, the high-order code bit (MSB) is activated.

Thus, the high-order code bit (MSB) indicates which encoder 90 or 92, if either, has an active input.

The other CODE bits, 96 through 96$i$ or 97 through 97$i$, are selected from the code outputs of either encoder 90 or 92 respectfully. Since each of these CODE bits identifies one of known logic reduction techniques are used to eliminate those inputs and associated circuits.

Figure 6:
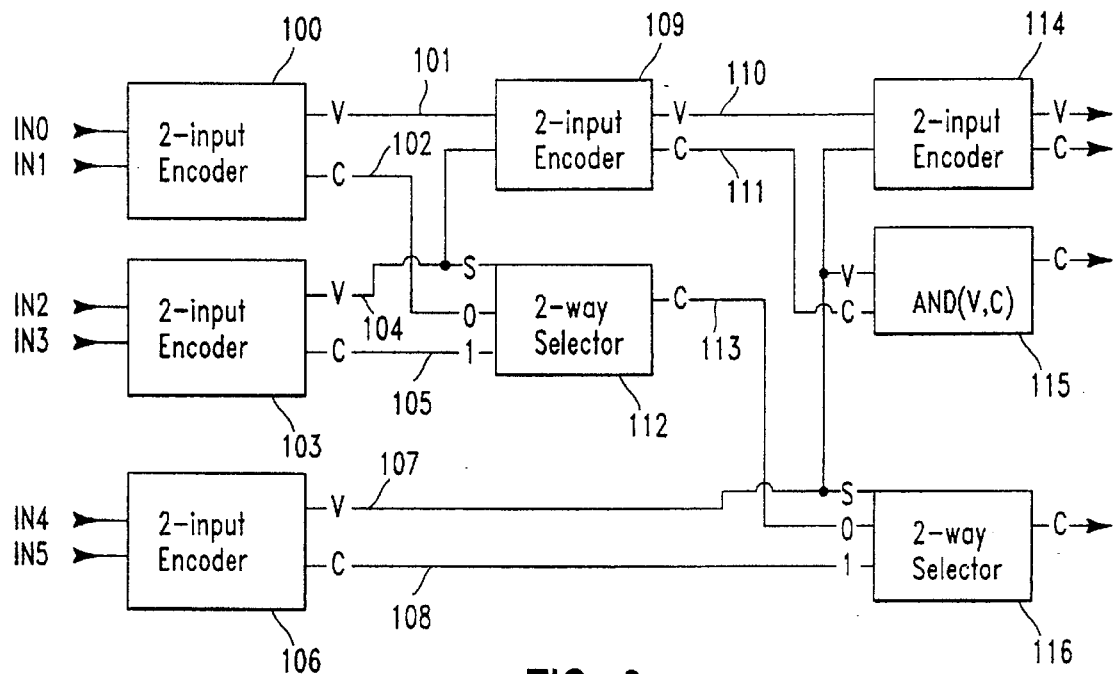
FIG. 6 shows in block form an encoder in accordance with the present invention in which the number of inputs is not a positive integer power of 2.

As shown in FIG. 6, the 6-input encoder network comprises three 2-input encoders 100, 103 and 106, a 2-input encoder 109 coupled to the Valid outputs 101 and 104 of the 2-input encoders 100 and 103 respectively and a 2-way selector circuit 112 connected to the CODE outputs of the 2-input encoder 100 and 103. The third encoder 106 has its VALID output 107 connected to an AND circuit 115 and to still another 2 input encoder 114 which is also coupled to the Valid output 110 of the 2-input encoder 109. The CODE output of the 2-input encoder 106 is also connected to an additional 2-way selector 116. The AND circuit 115 also receives the code output of the 2-input encoder 109 while the 2-way selector 116 also is connected to the output 113 of the 2-way selector 112.

The propagation delay through the disclosed encoder is proportional to the number of stages. For a $2^n$-input encoder, there are n stages and the propagation delay is proportional to n.

Figure 7:
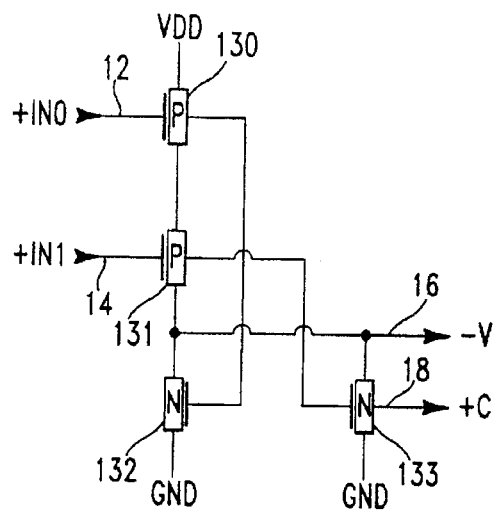
FIG. 7 shows a first transistorized implementation of a 2-input encoder.
Figure 8:
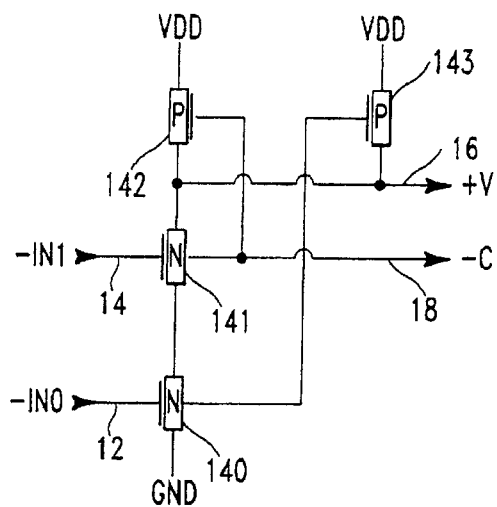
FIG. 8 shows a second transistorized implementation of a 2-input encoder which is the compliment of the circuit of FIG. 7.

Preferred CMOS implementations of the 2-input encoder block of FIG. 1, discussed above, can be implemented in transistor circuits as shown in FIGS. 7 and 8.

FIG. 7, shows an OR-INVERT (OI) version of a 2 input encoder circuit which comprises a transistor chain, formed of P type FET transistors 130 and 131 and an N type transistor 132, coupled in series between a voltage source VDD and ground. A VALID output line 16 is connected between the transistors 131 and 132. The gate of transistors 130 and 132 are both coupled to input 12 while the gate of transistor 131 is coupled to the input 14. This input 14 is further connected to the gate of an N type transistor 133 connected between the circuit output 134 and ground and to the CODE output line 18. This circuit provides a single gate of delay from input 12 to the VALID output, and no gate-delay from input 14 to the CODE output 135. The VALID output 134 is inverted relative to the inputs, however. Of course, inverting or non-inverting buffer circuits may be added but such circuits will affect propagation delays and/or signal polarities.

FIG. 8 is the compliment of the circuit shown in FIG. 7. That is, it is an AND-INVERT (AI) version of the 2 input encoder and comprises a transistor chain, formed of N type FET transistors 140 and 141, and a P type transistor 142, coupled in series between a voltage source VDD and ground. A VALID output line 16 is connected between the transistors 141 and 142. The gate of transistors 141 and 142 are both coupled to input 14 while the gate of transistor 140 is coupled to the input 12. This input 12 is further connected to the gate of a P type transistor 143 connected between the circuit output 16 and VDD. The input line 14 is coupled to the gates of transistors 141 and 142 and to the CODE output line 18. This circuit provides a single gate of delay from input 14 to the VALID output, and no gate-delay from input 12 to the CODE output 18. Again the VALID output 16 is inverted relative to the inputs 12 and 14.

A conventional two-way selector implements the following Boolean function:

OR (AND (SEL, INX), AND (NOT SEL, INY))

where SEL is the select input, INX is the input selected when SEL=1, INY is the input selected when AND, SEL=0, and OR are Boolean functions.

If such a selector were used to implement the disclosed network, the resulting network would include redundancies. The INX input of each selector can never be active unless the SEL input is also active. This is because INX and SEL can be traced back to the same 2-input encoder. Therefore, the 2-way selector circuit used with the present invention should implement the following preferred Boolean function,

OR (INX, AND (NOT SEL, INY))

Figure 9:
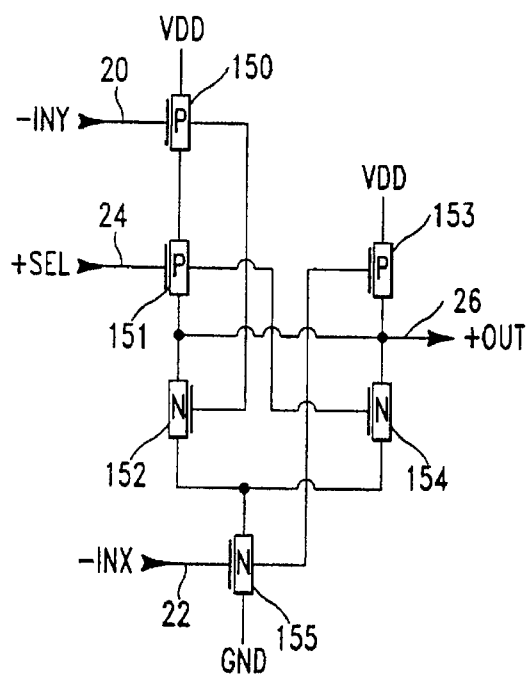
FIG. 9 shows a first transistorized implementation of a 2 way selector circuit.
Figure 10:
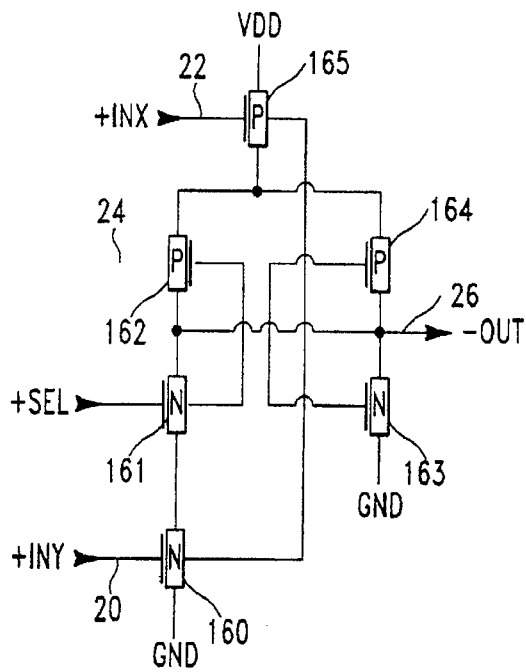
FIG. 10 shows a second transistorized implementation of a 2-way selector which is the compliment of the circuit of FIG. 9.

FIGS. 9 and 10 show 2-way selector circuits, formed of FET transistors, that will provided this preferred Boolian Function. Each of these circuits inverts the selected input. Of course, inverting or non-inverting buffer circuits may be added but will affect propagation delays and/or signal polarities.

In the disclosed encoder, the SELECT signal to each 2-way selector comes from the VALID output of a 2-input encoder, and the other two inputs INX and INY, to the selector, come from CODE outputs of the previous stage.

Preferred CMOS implementations of the 2-way selector block of FIG. 2, discussed above, can be implemented in transistor circuits as shown in FIGS. 9 and 10.

FIG. 9, shows the selector circuit as an OR-AND-INVERT (OAI) circuit and is comprised of a transistor chain, formed of P type FET transistors 150 and 151, and N type transistors 152 and 155, coupled in series between a voltage source VDD and ground. An output line 26 is connected between the transistors 151 and 152. The gate of transistors 150 and 152 are both coupled to the INY input 20 while the gate of transistor 151 is coupled to the SEL input 24. This input 24 is further connected to the gate of an N type transistor 154 connected to the circuit output 26 and through transistor 155 to ground. A pullup transistor 153 is between the output line 26 and the voltage source VDD. The gate of this transistor 153 is connected to INX input 22.

FIG. 10 is the compliment of the circuit shown in FIG. 9 and shows the selector circuit as an AND-OR-INVERT (AOI) circuit and is comprised of a transistor chain, formed of N type FET transistors 160 and 161, and P type transistors 162 and 165, coupled in series between a voltage source VDD and ground. The output line 26 is connected between the transistors 161 and 162. The gate of transistors 161 and 162 are both coupled to SEL input 24 while the gate of transistor 160 is coupled to the INY input 20 and the gate of transistor 165 is connected to the INX input 22. Input 20 is further connected to the gate of a P type transistor 164 connected between the circuit output 26 and through the transistor 165 to VDD. A pulldown transistor 163, having its gate connected to input 22 is coupled between the output line 26 and ground.

In the 2-input encoder of FIG. 7, the VALID output is expected to become valid some time after the CODE output. Therefore, the SELECT signal SEL to the 2-way selector is expected to arrive at the selector later than the other two inputs. The 2-way selector should preferably respond to a change at the SELECT input SEL faster than to a change at either of the other 2 inputs.

Each block of an encoder network, in accordance with the present invention, can be implemented using the circuits of FIGS. 7 through 10.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. An encoder comprising:
    a plurality of parallel encoders, each of said parallel encoders having N inputs coupled to a source of signals to be encoded, said N being an integer bigger than one, and each of said parallel encoders having N number of outputs, one of said outputs being a VALID output and remainder of said outputs being CODE outputs,
    a plurality of selector circuits, each having a number of inputs equal to the number of said CODE outputs of one of said plurality of parallel encoders, and
    an other encoder, having a number of input equal to the number of said plurality of said parallel encoders,
    each of said plurality of parallel encoders having a VALID output selectively coupled to an input of the other encoder, and each of said CODE outputs respectively connected to a respective input on each of said plurality of selector circuits.

2. The encoder of claim 1 wherein N is equal to $2^n$.

3. A binary-select encoder network for encoding inputs, ranked from lowest order to highest order comprising:
    first and second 2-input encoders, the first encoder having first and second high order inputs and the second encoder having first and second low order inputs;
    each of said first and second encoders having a VALID output and a CODE output;
    a third 2-input encoder having first and second inputs and a VALID and a CODE high order output; and
    a 2-way selector circuit having first and second data inputs a SELECT input and a CODE low order output;

the VALID outputs of said first and second 2-input encoders being respectively connected to the first and second inputs of said third 2-input encoder, the VALID output of the second 2-input encoder being further connected to the SELECT input of said 2-way selector circuit, and the CODE outputs of said first and second 2-input encoders being respectively connected to the first input and second inputs of said 2-way selector circuit.

4. A binary-select encoder network for encoding inputs, ranked from lowest order to highest order comprising:

first, second and third 2-input encoders, each having first and second data inputs and a VALID output and a CODE output;

a fourth 2-input encoder having first and second inputs and a VALID output and a CODE output;

first and second 2-way selectors each having first and second data inputs, a SELECT input, and a CODE output;

the VALID outputs of said first and second 2-input encoders being respectively connected to the first and second inputs of said fourth 2-input encoder, the VALID output of the second 2-input encoder being further connected to the SELECT input of said first 2-way selector, the CODE outputs of said first and second 2-input encoders being respectively connected to the first input and the second input of said first 2-way selector;

a fifth 2-input encoder having first and second inputs, a VALID output and a CODE output; and an AND circuit having first and second inputs and a CODE output;

the VALID output of the fourth 2-input encoder being coupled to the first input of the fifth 2-input encoder;

the CODE output of the fourth 2-input encoder being coupled to the second input of said AND circuit;

the VALID output of said third 2-input encoder being respectively connected to the SELECT input of said second 2-way selector, coupled to the first input of said AND circuit and coupled to the second input of said fifth encoder; and the CODE output of the first 2-way selector being connected to the first input of the second 2-way selector.

5. A binary-select encoder network for encoding inputs, ranked from lowest order to highest order comprising:

a first and a second $2^i$ input encoder, the inputs of said first $2^i$ input encoder being respectively coupled to the $2^i$ high order inputs and the inputs of the second such encoder being respectively coupled to the $2^i$ low order inputs;

each of said $2^i$ input encoders having a VALID output and a plurality of CODE outputs:

a 2-input encoder having first and second inputs, a VALID output and a CODE output; and a plurality of 2-way selectors, each of said selectors having a SELECT input, a first input, a second input and a CODE output;

the VALID output of said first $2^i$ input encoder being connected to the first input of said 2-input encoder, and the VALID output of said second $2^i$ input encoder being connected to the second input of said 2-input encoder and to the SELECT input of said plurality of said 2-way selectors, and respective ones, of the CODE outputs of said first $2^i$ input encoder being connected to respective first inputs of said plurality of 2-way selectors, and respective ones of the CODE outputs of said second $2^i$ input encoder being connected to respective second inputs of said plurality of 2-way selectors, wherein the VALID output of said 2-input encoder being the VALID output of said encoder network, the CODE output of said 2-input encoder being the most significant bit of the output of said encoder network and the CODE outputs of said 2-way selectors being the remaining bits of the output of said encoder network, said outputs of said 2-way selectors being ordered in the order of the CODE outputs of said $2^i$ input encoders.

6. An encoder comprising:

first and second parallel encoders having N inputs coupled to a source of signals to be encoded, said N being an integer bigger than one, and each of said parallel encoders having a VALID output and first and second CODE outputs, first and second selector circuits, each having a select input, first and second inputs and a CODE output, an other encoder, having a number of inputs equal to the number of said first and second parallel encoders, each of said first and second parallel encoders having a VALID output selectively coupled to a respective input of the other encoder, the first CODE outputs respectively connected to the first input on each of said plurality of selector circuits, and the second CODE outputs respectively connected to the second input on each of said plurality of selector circuits.

7. The encoder of claim 6 wherein:

said VALID output of said second parallel encoder is further connected to the select input of said first and second selector circuits.

* * * * *